(12) United States Patent
Frulio

(10) Patent No.: US 9,489,990 B1
(45) Date of Patent: Nov. 8, 2016

(54) ADAPTIVE NON-VOLATILE MEMORY PROGRAMMING

(71) Applicant: Atmel Corporation, San Jose, CA (US)

(72) Inventor: Massimiliano Frulio, Milan (IT)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 14/943,566

(22) Filed: Nov. 17, 2015

(51) Int. Cl.
*G11C 16/34* (2006.01)
*G11C 7/00* (2006.01)

(52) U.S. Cl.
CPC *G11C 7/00* (2013.01); *G11C 16/34* (2013.01)

(58) Field of Classification Search
CPC ..... G11C 7/00; G11C 16/34; G11C 16/3404; G11C 16/3409; G11C 16/3413; G11C 29/00
USPC ............ 365/189.11, 185.02, 185.09, 185.22, 365/185.29, 200, 201
See application file for complete search history.

(56) References Cited

U.S. PATENT DOCUMENTS

| | | | | |
|---|---|---|---|---|
| 7,239,557 B2* | 7/2007 | Ha | ..................... | G11C 16/3404 365/185.17 |
| 8,218,366 B2* | 7/2012 | Dong | ................... | G11C 11/5628 365/185.02 |
| 2012/0224429 A1* | 9/2012 | Moschiano | ............ | G11C 16/06 365/185.19 |
| 2015/0340100 A1* | 11/2015 | Cai | ..................... | G11C 16/3459 365/185.03 |

* cited by examiner

*Primary Examiner* — Tan T. Nguyen
(74) *Attorney, Agent, or Firm* — Fish & Richardson P.C.

(57) ABSTRACT

In an embodiment, a method of programming non-volatile memory (NVM) comprises: determining, by control logic of an NVM system, a number of unsuccessful attempts to program NVM cells; responsive to the determining, dividing the NVM cells into at least a first group and a second group; programming the first group during a first programming cycle; and programming the second group during a second programming cycle, wherein the first programming cycle and second programming cycle are different.

10 Claims, 3 Drawing Sheets

ADAPTIVE NON-VOLATILE MEMORY PROGRAMMING

TECHNICAL FIELD

The subject matter of this disclosure relates generally to programming non-volatile memory (NVM).

BACKGROUND

Programming NVM cells uses a large amount of current per bit. In many NVM devices the current is provided by a charge pump. To ensure enough current is available for programming the NVM cells under worse case conditions many NVM designs will include an oversized charge pump. In some applications a charge pump that is designed for worse case conditions may still be too weak for NVM cell programming because of process variation or a marginal supply voltage.

SUMMARY

In an embodiment, a method of programming non-volatile memory (NVM) comprises: determining, by control logic of an NVM system, a number of unsuccessful attempts to program NVM cells; responsive to the determining, dividing the NVM cells into at least a first group and a second group; programming the first group during a first programming cycle; and programming the second group during a second programming cycle, wherein the first programming cycle and second programming cycle are different.

In an embodiment, a non-volatile memory (NVM) system comprises: NVM cells; a charge pump coupled to the NVM cells; and control logic configured to program the NVM cells, wherein the control logic is configured to: program the NVM cells during a single program cycle; and after a specified number of unsuccessful attempts to program the NVM cells, divide the NVM cells into at least two groups and program each group during different program cycles.

DETAILED DESCRIPTION

The disclosed embodiments provide an improved NVM programming flow that implements control logic that monitors the number of programming attempts, and after a given number of attempts have passed (e.g., 2 attempts), divides the NVM cells into N groups (e.g., even and odd bits) to reduce the current load on the charge pump. In this way, the charge pump can reach the target voltage level (e.g., 3.5 volts) needed for NVM programming. The programming can be achieved even if the charge pump provides less than the total needed current for the NVM programming.

Example System

Figure 1:
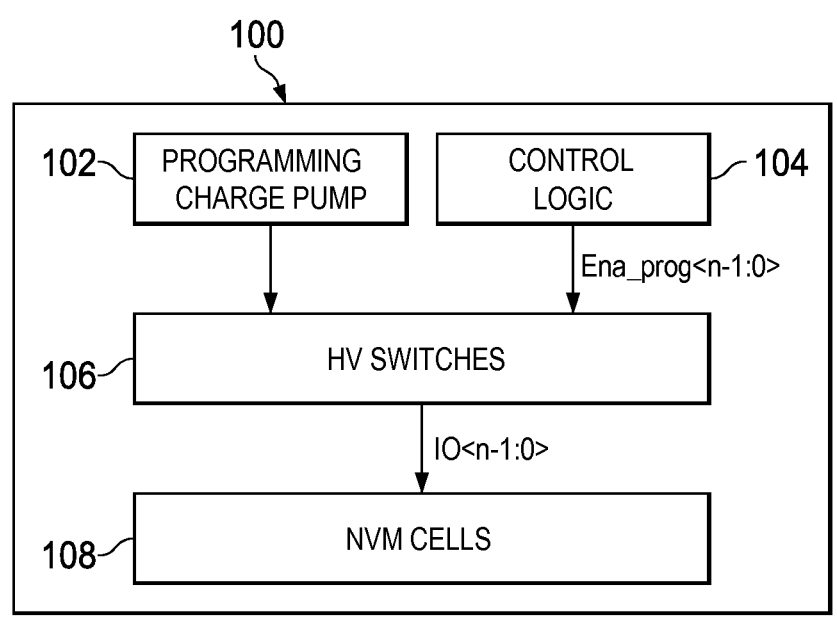
FIG. 1 is a conceptual block diagram of an example adaptive NVM programming system, according to an embodiment.

FIG. 1 is a conceptual block diagram of an example adaptive NVM programming system 100, according to an embodiment. In the example embodiment shown, adaptive NVM programming system 100 includes programming charge pump 102, control logic 104, high voltage (HV) switches 16 and NVM cells 108.

Programming charge pump 102 is configured to provide programming voltage pulses to NVM cells 108 through HV switches 106. Control logic 104 is configured to monitor the number of unsuccessful program attempts made by programming charge pump 102, as further described in reference to FIGS. 2 and 3. After a given number of unsuccessful program attempts (e.g., 2 attempts), control logic 104 divides the NVM cells 108 to be programmed into "N" groups of NVM cells 108 for parallel programming to reduce the current load on the charge pump 102. In an embodiment, control logic 104 is configured to halve the NVM cells 108 into two groups (e.g., even and odd bits or IOs) to halve the current load on charge pump 102. In this manner, charge pump 102 can provide the target programming voltage and restore programming efficiency. If the two groups of NVM cells 108 cannot be programmed after a second number of program attempts, control logic 108 halves each of the two groups for a total of four groups and attempts to program each group again. If the four groups of NVM cells 108 cannot be programmed after a third number of attempts, control logic 104 halves each of the four groups for total of eight groups and so forth until all NVM cells 108 are successfully programmed. In the embodiment described above, NVM cells 108 were halved into two groups with even numbers of NVM cells 108 in each group. In another embodiment, NVM cells 108 can be divided into groups with unequal numbers of NVM cells 108.

Figure 2:
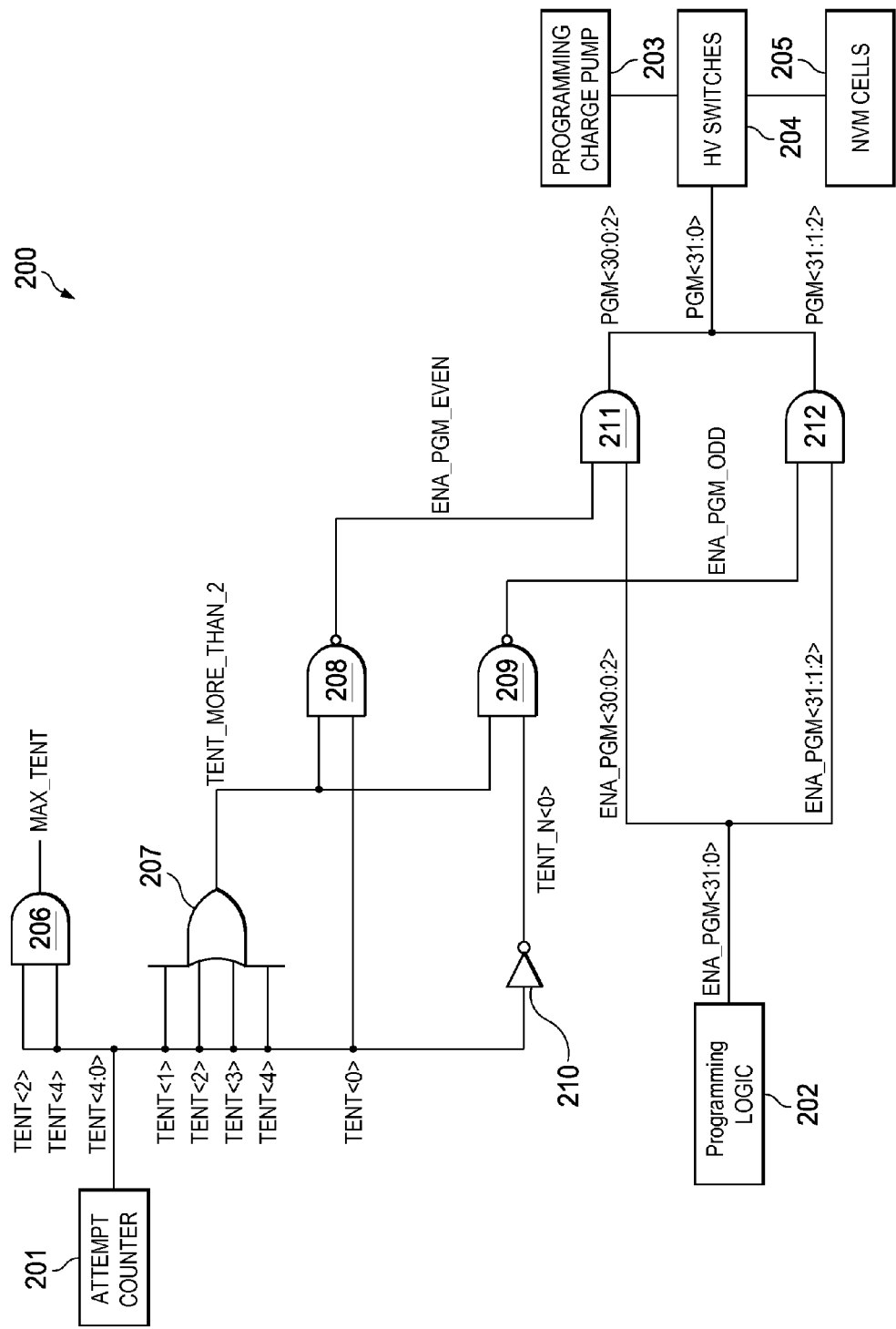
FIG. 2 is a schematic diagram of an example adaptive NVM programming system, according to an embodiment.

FIG. 2 is a schematic diagram of an example adaptive NVM programming system, according to an embodiment. In the example embodiment shown, NVM programming system 200 includes attempt counter 201, programming logic 202, programming charge pump 203, HV switches 204 and NVM cells 205. In the example embodiment shown, NVM programming system 200 includes various individual logic gates 206-212. In other embodiments, logic gates 206-212 can be replaced or augmented with additional or different logic gates or combinations of two or more logic gates to provide the desired functionality described herein.

In an embodiment, charge pump 203 is configured to generate voltage pulses to program NVM cells 205. HV switches 204 switch the pulses to the desired NVM cells 205 to be programmed based on a "n"-bit programming word PGM<n-1:0> output by programming logic 202. Attempt counter 201 is configured to monitor the number of program attempts and to increment by one after each failed attempt. The count output by attempt counter 201 is input into logic 207 (e.g., an OR gate), which provides an output signal when a threshold number of program attempts have occurred, which in this example is 2 attempts.

Logic 208 (e.g., a NAND gate) generates an even program enable signal (ENA_PGM_EVEN) and logic 209 (e.g., a NAND gate) generates odd program enable signal (ENA_PGM_ODD) when the count TENT <4:0> output by attempt counter 201 indicates that attempt number 2 was made. In an embodiment, logic 206 (e.g., an AND gate) outputs a maximum number of attempts MAX_TENT (e.g., 20 attempts), which can be used to signal a programming failure to, for example, a microcontroller or other device.

Programming logic 202 is configured to generate the "n"-bit programming word PGM <n-1:0> for program control selection, according to a pattern to be written into NVM cells 205. In an embodiment, a 32-bit programming word is divided into even and odd program enable words, where ENA_PGM <30:0:2> is the even program enable word and ENA_PGM <31:1:2> is the odd program enable word. The even and odd program enable words are input into logic gates 211, 212 (e.g., AND gates), respectively. Logic 211, 212 also take as inputs the even and odd program enable signals (ENA_PGM_EVEN, ENA_PGM_ODD) output by logic 208, 209, respectively. The outputs of logic 211, 212 are even and odd program words PGM <30:0:2> and PGM <31:1:2>, respectively. When two program attempts have passed, the even and odd program words are alternately output to HV switches 204 during two different programming cycles. The even and odd program words couple the pulses from programming charge pump 203 to selected ones of HV switches 204 according to the bits in the even or odd program words.

System 200 described above determines if a specified number of program attempts have occurred and, if so, halves NVM cells 205 into even and odd groups, where NVM cells 205 in the even group are programmed in parallel during a first programming cycle, which is followed by the odd group of NVM cells 205 being programmed in parallel during a second programming cycle following the first programming cycle. By halving NVM cells 205 into even and odd groups and programming the groups during different programming cycles, the current load on charge pump 203 at an given time is halved, allowing charge pump 203 to deliver programming current at the target voltage to ensure programming success. In an embodiment, the halving of NVM cells 205 is iterative, and if the first two groups of NVM cells 205 are not successfully programmed after the specified number of program attempts, the even and odd groups of NVM cells 205 are each halved again to create a total of four groups of NVM cells 205 and a specified number of program attempts is made on each of the four groups and so forth. In an embodiment, the specified number of program attempts is different for each group.

Example Processes

Figure 3:
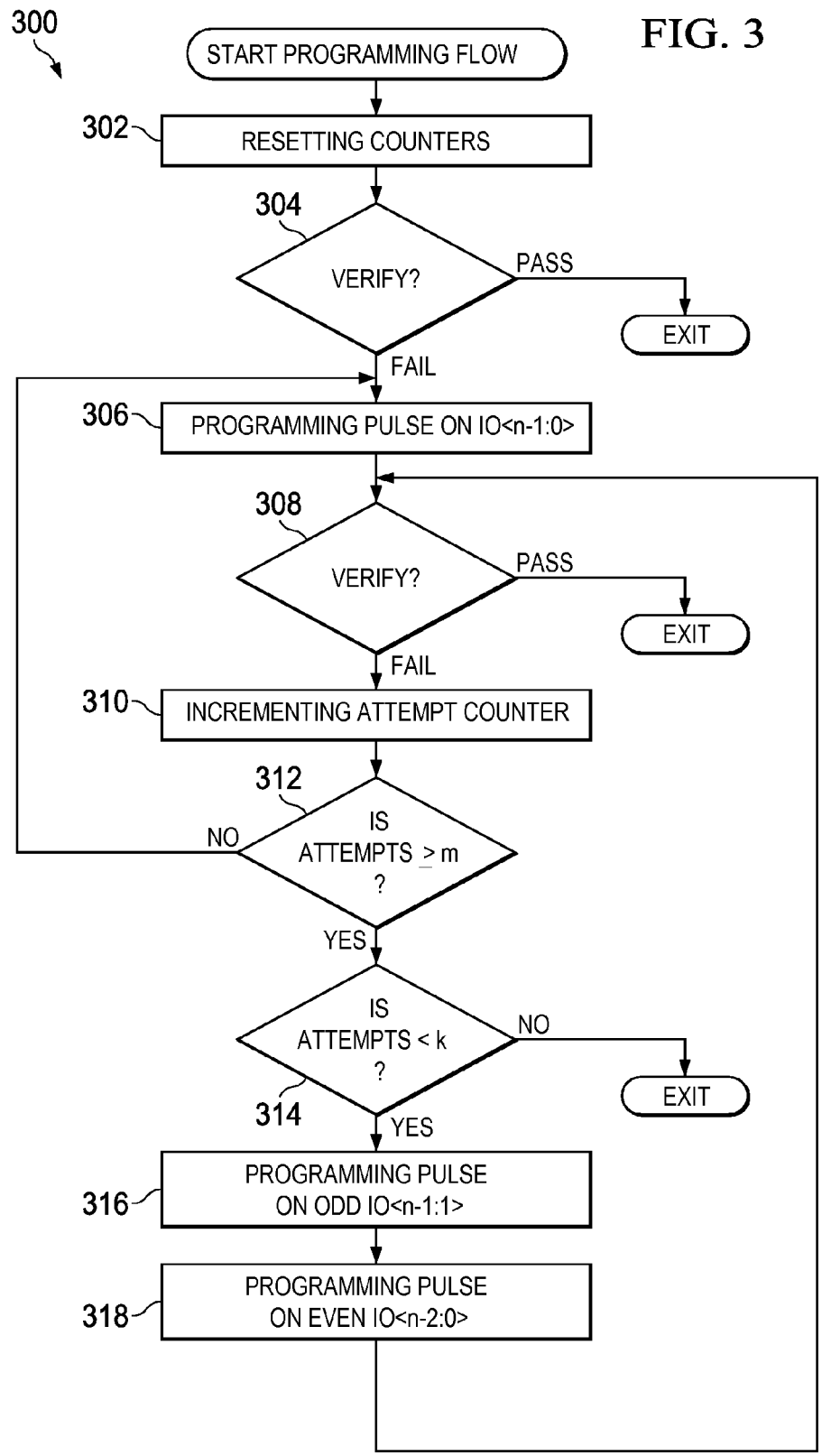
FIG. 3 is a flow diagram of an example process performed by a NVM programming system, according to an embodiment.

FIG. 3 is a flow diagram of an example process 300 performed by a server node in a wireless sensor network, according to an embodiment. Process 300 can be implemented by, for example, system 200 described in reference to FIG. 2.

In an embodiment, process 300 begins by resetting an attempt counter (302) and performing a program verification operation to ensure that the NVM cells are not already programmed (the NVM cells have been completely erased) (302). If the program verification passes, the NVM cells have already been programmed and process 300 exits. If the program verification fails, the NVM cells have not already been programmed and process 300 continues.

Process 300 continues by attempting to program the NVM cells (306) and perform program verification (308). If the programming succeeds process 300 exits. If the programming fails, the attempt counter is incremented (310) and process 300 determines (312) if the attempt count is greater than or equal to a threshold number of attempts "m" (e.g., m=2). If the attempt count is not greater than or equal to m, process 300 returns to step 306 where another attempt to program the NVM cells is made.

If the attempt count is greater than or equal to m, process 300 determines if the attempt count is less than a maximum number of attempts "k" (314). If the attempt count is not less than k, process 300 exits. If the program attempt count is less than k, an attempt to program the odd numbered NVM cells in parallel is performed in a first program cycle (316), followed by an attempt to program the even numbered NVM cells in parallel in a second program cycle (318) and verification is performed again at step 308. Process 300 continues as described above until the earlier of programming success of all NVM cells or the maximum number of attempts k are made.

While this document contains many specific implementation details, these should not be construed as limitations on the scope of what may be claimed but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method of programming non-volatile memory (NVM) comprising:
   determining, by control logic of an NVM system, a number of unsuccessful attempts to program NVM cells;
   responsive to the determining, dividing the NVM cells into at least a first group and a second group;
   programming the first group during a first programming cycle; and
   programming the second group during a second programming cycle, wherein the first programming cycle and second programming cycle are different.

2. The method of claim 1, wherein dividing the NVM cells into at least a first group and a second group further comprises:
   dividing the NVM cells into an odd group and an even group.

3. The method of claim 1, wherein determining the number of unsuccessful attempts further comprises:
   incrementing a counter of the NVM system after each failed attempt to program the NVM cells.

4. The method of claim 1, wherein determining a number of unsuccessful attempts to program NVM cells further comprises:
   determining, by the control logic, if the number of attempts is greater than or equal to a threshold number of attempts; and
   determining, by the control logic, if the number of attempts is less than a maximum number of attempts.

5. The method of claim 1, further comprising:
   determining that an attempt to program the first or second groups of NVM cells was unsuccessful;
   dividing the first and second groups of NVM cells into additional groups of NVM cells; and
   attempting to program the additional groups of NVM cells.

6. A non-volatile memory (NVM) system comprising:
   NVM cells;
   a charge pump coupled to the NVM cells; and
   control logic configured to program the NVM cells, wherein the control logic is configured to:
   program the NVM cells during a single program cycle; and after a specified number of unsuccessful attempts to program the NVM cells, divide the NVM cells into at least two groups and program each group during different program cycles.

7. The system of claim 6, wherein the control logic is further configured to divide the at least two groups of NVM cells into odd and even groups.

8. The system of claim 6, further comprising:
a counter configured to increment after each unsuccessful attempt to program the NVM cells.

9. The system of claim 8, wherein the control logic is configured to:
determine if the number of unsuccessful attempts is greater than or equal to a threshold number of attempts based on the counter; and
determine if the number of unsuccessful attempts is less than a maximum number of attempts based on the counter.

10. The system of claim 6, wherein the control logic is configured to:
determine that an attempt to program the groups of NVM cells is unsuccessful;
divide the at least two groups of NVM cells into additional groups of NVM cells; and
attempt to program the additional groups of NVM cells.

* * * * *